US012563683B2

(12) United States Patent
Lin et al.

(10) Patent No.: US 12,563,683 B2
(45) Date of Patent: Feb. 24, 2026

(54) LOCK DEVICE STRUCTURE

(71) Applicant: FOSITEK CORPORATION, New Taipei (TW)

(72) Inventors: Chun Han Lin, New Taipei (TW); Che Wei Chang, New Taipei (TW)

(73) Assignee: Fositek Corporation, New Taipei (TW)

( * ) Notice: Subject to any disclaimer, the term of this patent is extended or adjusted under 35 U.S.C. 154(b) by 67 days.

(21) Appl. No.: 18/495,195

(22) Filed: Oct. 26, 2023

(65) Prior Publication Data

US 2025/0137304 A1 May 1, 2025

(51) Int. Cl.
| | |
|---|---|
| *H05K 5/02* | (2006.01) |
| *E05B 65/00* | (2006.01) |
| *E05C 1/00* | (2006.01) |
| *H05K 7/14* | (2006.01) |

(52) U.S. Cl.
CPC ......... *H05K 5/0221* (2013.01); *E05B 65/006* (2013.01); *E05C 1/004* (2013.01); *H05K 7/1488* (2013.01)

(58) Field of Classification Search
CPC . E05C 5/02; E05C 5/005; E05C 1/004; E05C 1/12; E05C 1/14; E05C 1/145; H05K 5/0221; H05K 7/1488; Y10T 292/0867; Y10T 292/0839; Y10T 292/0871; E05B 7/00; E05B 9/02; E05B 13/002; E05B 13/01; E05B 15/04; E05B 2015/0413; E05B 65/006; Y10S 292/30; Y10S 292/31
See application file for complete search history.

(56) References Cited

U.S. PATENT DOCUMENTS

| | | | | |
|---|---|---|---|---|
| 279,334 | A | * 6/1883 | Clark | ...................... E05C 9/043 292/DIG. 3 |
| 4,320,642 | A | * 3/1982 | Pastva, Jr. | ............... E05C 1/145 292/DIG. 31 |

(Continued)

FOREIGN PATENT DOCUMENTS

| | | | | |
|---|---|---|---|---|
| CN | 111827808 A | * 10/2020 | ............... | B60R 7/04 |
| CN | 215407954 U | 1/2022 | | |

(Continued)

OTHER PUBLICATIONS

Communication from Taiwan patent office in a counterpart foreign application dated 2024 (Taiwan Year 113) May 9.

*Primary Examiner* — Steven A Tullia
(74) *Attorney, Agent, or Firm* — Rosenberg, Klein & Lee

(57) ABSTRACT

A lock device structure includes an assembly of a case body and an actuator body, a linking member and a slide body mounted on the case body. The actuator body has two arm sections and a notch section positioned between the two arm sections. An operation member and an elastic member are disposed in the notch section. The elastic member serves to make the operation member reciprocally move in an axial direction of the actuator body. The linking member has a first end pivotally connected with the actuator body (or the operation member) and a second end connected with the slide body. When an operator pulls (and pushes) the operation member to move, the actuator body is permitted to move from a closed position to an open position to drive the linking member and the slide body to move.

15 Claims, 6 Drawing Sheets

(56) References Cited

U.S. PATENT DOCUMENTS

| | | | | | |
|---|---|---|---|---|---|
| 4,638,649 | A | * | 1/1987 | Chao | E05B 65/5269 |
| | | | | | 292/DIG. 31 |
| 4,828,299 | A | * | 5/1989 | Poe | E05B 63/128 |
| | | | | | 292/DIG. 31 |
| 5,201,557 | A | * | 4/1993 | Schlack | E05C 9/1858 |
| | | | | | 292/DIG. 31 |
| 5,416,479 | A | * | 5/1995 | Jondrow | H01H 9/167 |
| | | | | | 345/157 |
| 5,984,382 | A | * | 11/1999 | Bourne | E05C 19/145 |
| | | | | | 292/DIG. 31 |
| 6,343,815 | B1 | * | 2/2002 | Poe | E05C 19/145 |
| | | | | | 292/DIG. 31 |
| 6,824,174 | B2 | * | 11/2004 | Lin | E05C 19/06 |
| | | | | | 292/85 |
| 7,185,926 | B2 | * | 3/2007 | Helsley | E05C 19/14 |
| | | | | | 292/113 |
| 7,441,812 | B2 | * | 10/2008 | Welsh | E05B 17/0025 |
| | | | | | 292/DIG. 31 |
| 8,270,173 | B2 | * | 9/2012 | Chang | H05K 5/0221 |
| | | | | | 455/575.8 |
| 8,297,464 | B2 | * | 10/2012 | Grenier | A45C 13/1084 |
| | | | | | 220/314 |
| 8,991,228 | B2 | * | 3/2015 | Yang | E05B 65/006 |
| | | | | | 292/336.3 |
| 9,380,718 | B2 | * | 6/2016 | Wang | H05K 5/0221 |
| 10,561,034 | B2 | * | 2/2020 | Wu | H05K 5/0204 |
| 10,645,822 | B2 | * | 5/2020 | Wu | G06F 1/181 |
| 11,304,322 | B2 | * | 4/2022 | Lu | H05K 5/03 |
| 2004/0222647 | A1 | * | 11/2004 | Smith | E05C 19/006 |
| | | | | | 292/336.3 |
| 2011/0127895 | A1 | * | 6/2011 | Conn | E05B 65/006 |
| | | | | | 312/294 |
| 2015/0315811 | A1 | * | 11/2015 | Mao | E05B 5/003 |
| | | | | | 292/336.3 |

FOREIGN PATENT DOCUMENTS

| | | | | | | |
|---|---|---|---|---|---|---|
| DE | 202007010029 | U1 | * | 2/2008 | | A45C 13/10 |
| EP | 3235978 | A1 | * | 10/2017 | | E05B 13/10 |
| ES | 2562329 | T3 | * | 3/2016 | | E05B 65/10 |
| FR | 3075847 | A1 | * | 6/2019 | | E05B 5/00 |
| GB | 2083123 | B | * | 1/1984 | | E05C 19/14 |
| JP | 3589982 | B2 | * | 11/2004 | | E05C 9/02 |
| TW | 202316020 | A | | 4/2023 | | |

* cited by examiner

LOCK DEVICE STRUCTURE

BACKGROUND OF THE INVENTION

1. Field of the Invention

The present invention relates generally to a lock device structure, and more particularly to a lock device structure, in which an operator member is assembled with an elastic member and disposed on a case body to improve the smoothness (or convenience) in operation of the conventional structure.

2. Description of the Related Art

A conventional lock device or the like device is mounted on the cover board structure of a computer/electronic apparatus, a server chassis, etc., whereby an operator can open/close the cover board structure of the computer/electronic apparatus or close the cover board structure onto the chassis main body and lock the cover board structure with the chassis main body so as to prevent the components or parts inside the chassis from being exposed to outer side. Alternatively, the operator can unlock the cover board structure and open the same for arranging or maintaining the components inside the chassis.

For example, U.S. Pat. No. 6,174,007 B1 "actuator assembly", U.S. Pat. No. 7,201,407 B2 "sliding panel latch" and U.S. Pat. No. 8,256,737 B2 "leverage device and system using same" disclose typical embodiments.

Such lock or latch device generally includes a case body, an actuator handle and a slide plate. A pushbutton is disposed at one end of the case body. The actuator handle has a pivoted end pivotally connected with the other end of the case body in cooperation with a spring. The other end of the actuator handle is pivotally connected with a link. In addition, a protrusion section is disposed at the other end of the actuator handle. The protrusion section can be inserted into the pushbutton and locked therein. When an operator operates the pushbutton to release the protrusion section, the spring pushes the actuator handle to open the same. At this time, the slide plate is driven to move and the link lifts the actuator handle.

Another conventional lock or latch device includes an assembly of a case body, an actuator body, a linking member and a slide body mounted on the case body. The actuator body has a free end and a pivoted end pivotally connected with the case body in cooperation with an elastic unit, whereby the actuator body can reciprocally move. The free end of the actuator body has a notch section. An operation member is disposed in the notch section and can swing therein. The linking member has a first end and a second end. The first end is pivotally connected with the free end of the actuator body (or the operation member). The second end is connected with the slide body. When an operator presses the operation member (to swing), the actuator body can move from a closed position to an open position to drive the linking member and the slide body to move.

The conventional lock or latch device has some shortcomings in assembling form, structure and operation application. For example, when an operator presses the operation member, the pressing direction is reverse to the swinging or opening direction of the actuator handle (or actuator body). This affects the smoothness or convenience in operation. This is not what we expect.

To speak representatively, the above references reveal some shortcomings existing in the conventional lock or latch device or the like lock or latch mechanism in structure assembly design and application. In case the structure assembly form of the lock or latch device (or fastening device) is redesigned to be different from the conventional lock or latch device, the use form of the lock or latch device can be changed to practically enhance the application effect thereof.

It is found that the structural form of an optimal lock or latch device or fastening device must overcome or improve the aforesaid shortcomings of the conventional lock or latch device and should include several design considerations as follows:

1. In condition that the lock device structure can be smoothly (or conveniently) operated, the shortcoming of the structural form of the conventional lock device structure that the moving direction of the operation member is reverse to the opening direction must be improved.
2. The lock device structure must provide an improvement, which enables an operator to (easily) move the actuator body (and/or the linking member and the slide body) toward the open position.

All the above issues are not taught or substantially disclosed in the above references.

SUMMARY OF THE INVENTION

It is therefore a primary object of the present invention to provide a lock device structure including an assembly of a case body and an actuator body, a linking member and a slide body mounted on the case body. The actuator body has a free end and a pivoted end pivotally connected with the case body in cooperation with an elastic unit, whereby the actuator body can reciprocally move. The free end of the actuator body has two arm sections and a notch section positioned between the two arm sections. An operation member and an elastic member are disposed in the notch section. The elastic member serves to make the operation member reciprocally move in an axial direction of the actuator body. The linking member has a first end pivotally connected with the free end of the actuator body (or the operation member) and a second end connected with the slide body. When an operator pulls (and pushes) the operation member to move, the actuator body is permitted to move from a closed position to an open position to drive the linking member and the slide body to move. The lock device structure improves the shortcoming of the conventional structure that the moving direction of the operation member is reverse to the opening direction and the smoothness (or convenience) in operation is affected.

In the above lock device structure, the operation member includes an operable base body and a main section and a subsidiary section positioned at two ends of the base body. The operation member or the main section is formed with a subsidiary mounting section (in the form of a socket or a boss structure) for assembling with or accommodating the elastic member. The subsidiary section is formed with a (hook-shaped) locating section. The case body is formed with a subsidiary locating section (in the form of a window) corresponding to the locating section. When the actuator body is positioned in a closed position (or the actuator body is closed onto the case body), the locating section is engaged with the subsidiary locating section, whereby the actuator body is securely engaged with the case body.

The present invention can be best understood through the following description and accompanying drawings, wherein:

DETAILED DESCRIPTION OF THE PREFERRED EMBODIMENTS

Figure 1:
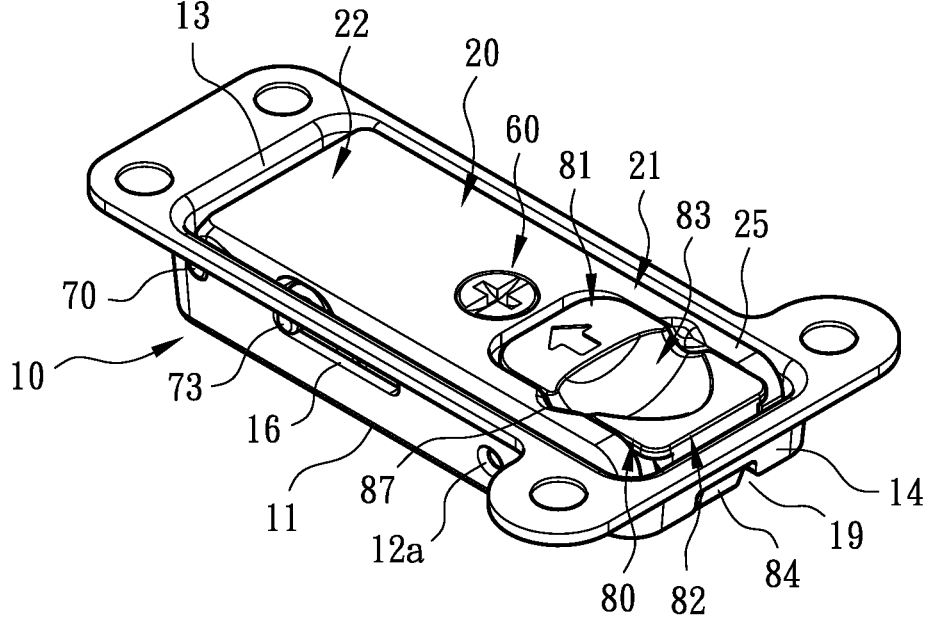
FIG. 1 is a perspective assembled view of the present invention.
Figure 2:
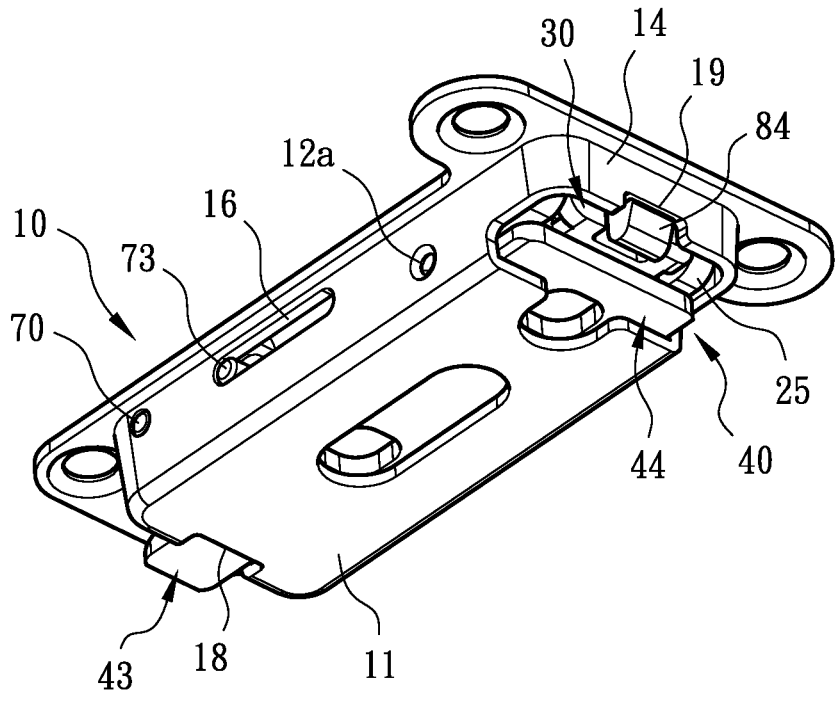
FIG. 2 is a perspective assembled view of the present invention, seen from another angle.
Figure 3:
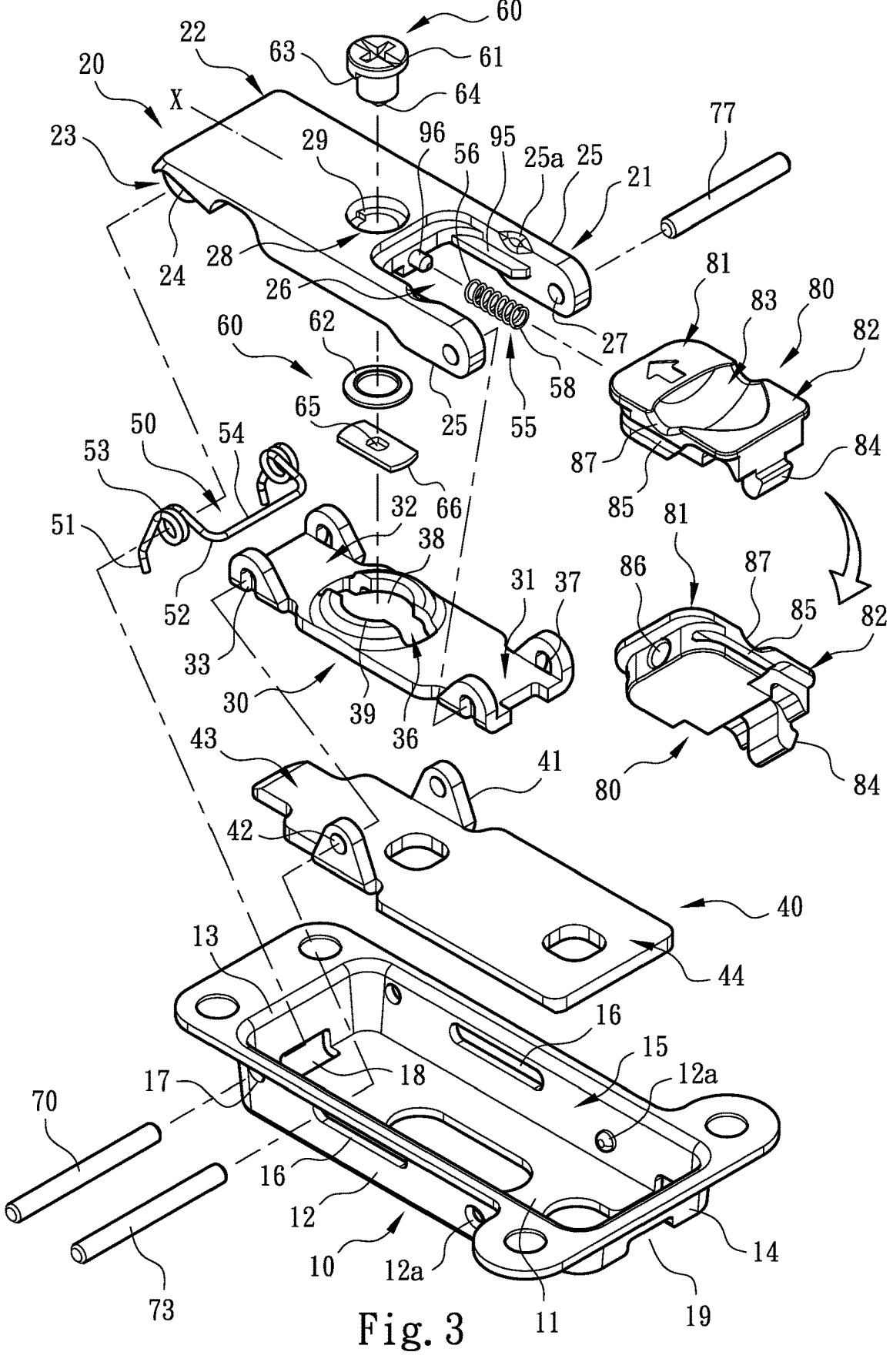
FIG. 3 is a perspective exploded view of the present invention, showing the structures of the case body, the actuator body, the linking member, the slide body, the elastic unit and the elastic member of the present invention.

Please refer to FIGS. 1, 2 and 3. The lock device structure of the present invention includes an assembly of a case body 10, an actuator body 20, a linking member 30 and a slide body 40. The case body 10 has a bottom wall 11, two sidewalls 12 extending in a direction in parallel to an axial direction of the case body 10, a main end wall 13 connected with the sidewalls 12 and perpendicular to the axial direction of the case body 10 and a subsidiary end wall 14 connected with the sidewalls 12 and perpendicular to the axial direction of the case body 10. The bottom wall 11, the sidewalls 12, the main end wall 13 and the subsidiary end wall 14 together define an open chamber 15 of the case body 10 for accommodating the actuator body 20, the linking member 30 and the slide body 40.

The upper section, upper side, lower section, lower side, right side, left side, lateral side, etc. mentioned hereinafter are recited with the direction of the drawings as the reference direction.

As shown in the drawings, each of the sidewalls 12 of the case body 10 is formed with a slot 16. The main end wall 13 is formed with an opening 18. The subsidiary end wall 14 is formed with a subsidiary locating section 19 in the form of a window. In addition, a raised structure 12a is disposed on an inner side of each sidewall 12 of the case body 10. The raised structures 12a serve to help in regulating the slide body 40 to smoothly slide within the chamber 15 of the case body 10.

In this embodiment, the actuator body 20 is a plate body structure defined with an axial direction X. The actuator body 20 has a free end 21 and a pivoted end 22 pivotally connected with the case body 10 in cooperation with an elastic unit 50, whereby the actuator body 20 can reciprocally move (swing) to achieve an effect of (simple harmonic motion).

To speak more specifically, the pivoted end 22 of the actuator body 20 has a shafted section 23 and two recessed sections 24 formed at two ends of the shafted section 23 for together assembling with (or locating) the elastic unit 50. The elastic unit 50 is selectively in the form of a torsion spring having two coiled sections 53, two first sections 51 and two second sections 52 connected with the coiled sections 53 and an extension section 54 (perpendicularly) connected with the second sections 52. The shaft section 23 is assembled with a shaft 70, which is fitted through the coiled sections 53 of the elastic unit 50 and two shaft holes 17 formed on the sidewalls 12 of the case body 10. The first sections 51 of the elastic unit 50 abut against the bottom wall 11 of the case body 10, while the second sections 52 of the elastic unit 50 abut against the actuator body 20 (or the recessed sections 24), whereby the actuator body 20 can reciprocally move (or swing) around the shaft 70 (and/or the shaft holes 17 and the shafted section 23).

As shown in the drawings, the free end 21 of the actuator body 20 has two protruding arm sections 25 (in parallel to each other) and a notch section 26 positioned between the two arm sections 25. The arm sections 25 are formed with dented sections 25a to facilitate operation of (a finger of) an operator. In addition, two rails 95 are disposed on inner sides of the arm sections 25 in parallel to the axial direction X of the actuator body 20. The free end 21 or tail sections of the arm sections 25 are formed with pinholes 27, through which a shaft pin 77 is correspondingly pivotally fitted.

In this embodiment, a mounting section 96 is disposed on a section of the actuator body 20 inside the notch section 26 (or on a section of the actuator body 20 distal from the tail sections of the arm sections 25) for assembling with (or locating) an elastic member 55. The mounting section 96 is in the form of a stake or a socket structure. An operation member 80 and the elastic member 55 are arranged in the notch section 26, whereby the elastic member 55 serves to make the operation member 80 reciprocally move in the axial direction X of the actuator body 20.

To speak more specifically, the operation member 80 includes an operable base body 83 and a main section 81 and a subsidiary section 82 respectively positioned at two ends of the base body 83. The base body 83 is in the form of a depression structure (and/or two recesses 87 are formed on two sides of the base body 83 in connection with the depression structure corresponding to the dented sections 25a of the arm sections 25), whereby an operator can easily pull (or push) the operation member 80 to move. Two subsidiary rails 85 are disposed on two sides of the operation member 80 corresponding to the rails 95 of the arm sections 25. The subsidiary rails 85 are assembled with the rails 95, whereby the operation member 80 can more smoothly reciprocally (linearly) move in the axial direction X to ensure that during the move of the operation member 80 along the actuator body 20, the operation member 80 is always positioned in a true position in the notch section 26 (or between the two arm sections 25).

The operation member 80 or the main section 81 is formed with a subsidiary mounting section 86 (in the form of a socket structure or a boss structure) for assembling with or accommodating the elastic member 55. The subsidiary section 82 is formed with a hook-shaped locating section 84. When the actuator body 20 is positioned in a closed position (or the actuator body 20 is closed onto the case body 10), the locating section 84 is assembled with (or engaged with) the subsidiary locating section 19, whereby the actuator body 20 (or the operation member 80) is securely engaged with or fastened with the case body 10.

In a preferred embodiment, the elastic member 55 is selectively a coiled spring (or an elastic member in another form). The elastic member 55 has a first section 56 located (or assembled) on the mounting section 96 and a second section 58 accommodated in (or pressed against) the subsidiary mounting section 86. The elastic member 55 serves to make the operation member 80 reciprocally move and keep the locating section 84 and the subsidiary locating section 19 engaged with each other.

As shown in the drawings, the linking member 30 has a first end 31 and a second end 32. The first end 31 is formed with pinholes 37 pivotally connected with the shaft pin 77, whereby the first end 31 of the linking member 30 is pivotally connected with the free end 21 of the actuator body 20 and can freely rotate (or swing).

In this embodiment, the second end 32 of the linking member 30 is formed with a shafted section 33 for pivotally connecting with a shaft pin 73, whereby the second end 32 of the linking member 30 can freely move or rotate. In addition, the shaft pin 73 is assembled with the shafted section 33 of the linking member 30 and pivotally connected with the slide body 40.

As shown in the drawings, the slide body 40 is a plate body freely movably mounted on the case body 10 (or the chamber 15). The slide body 40 has a main end 43 and a subsidiary end 44. Two assembling sections 41 in the form of lug structure are disposed on the slide body 40 between the main end 43 and the subsidiary end 44. Each assembling section 41 is formed with a shaft hole 42.

Accordingly, the shaft pin 83 is assembled with the shafted section 33 of the linking member 30 and the shaft holes 42 of the assembling sections 41 of the slide body 40. In addition, (two ends) of the shaft pin 73 are pivotally fitted in the slots 16 of the case body 10. When an operator operates (or pulls) the operation member 80 to move in the axial direction X, the actuator body 20 is permitted to move from the closed position to the open position. At this time, the linking member 30 is driven to make the shaft pin 73 move along the slots 16 and drive the slide body 40 to move. This improves the shortcomings of the conventional structure that the operation (pressing) direction is reverse to the opening direction and the smoothness (or convenience) in operation is affected.

The aforesaid closed position means a position where the actuator body 20 is closed onto the case body (or the chamber 15). The open position means a position where the actuator body 20 (or the free end 21) is moved away from the case body 10.

It should be noted that the moving range (or angle) of the actuator body 20, which is opened from the case body 10 or closed onto the case body 10 can be controlled by the distance between the shafted section 33 and the pinholes 37 of the linking member 30 and the moving distance of the slide body 40 (and/or the length of the slots 16 and the moving distance of the shaft pin 73).

Please refer to FIG. 3. A perforation 28 is formed on the actuator body 20 between the free end 21 and the pivoted end 22. A restriction section 29 is formed on the perforation 28. A lock mechanism 60 is mounted in the perforation 28. The lock mechanism 60 includes an assembly of a rotary body 61 received in the perforation 28 and a lock plate 62 pivotally connected with the rotary body 61.

As shown in the drawings, the rotary body 61 is formed with a subsidiary restriction section 63 and a base section 64 in the form of a stem structure. The lock plate 62 is (integrally) assembled with a wing section 66 having a connection section 65 in the form of a hole. In addition, after the lock mechanism 60 is mounted in the perforation 28, the base section 64 is permitted (to protrude from the perforation 28) to pivotally connect with the connection section 65. When an operator rotates the rotary body 61, the restriction section 29 of the actuator body 20 can stop the subsidiary restriction section 63 so as to regulate the rotational angle or rotational range of the rotary body 61.

In this embodiment, a lock hole 36 is formed on the linking member 30 between the first end 31 and the second end 32 corresponding to the structure of the lock mechanism 60, whereby the lock plate 62 (or the wing section 66) can pass through the lock hole 36. The lock hole 36 is composed of a through hole 38 and an annular raised section 39 formed around the through hole 38.

It should be noted that when the lock mechanism 60 is in a locked state, the wing section 66 is locked on the lock hole 36 (or the annular raised section 39). Under such circumstance, the actuator body 20, the linking member 30 and the slide body 40 are securely locked with the case body 10 (or the chamber 15). After an operator rotates the rotary body 61, the wing section 66 is unlocked from the lock hole 36 of the linking member 30.

Figure 4:
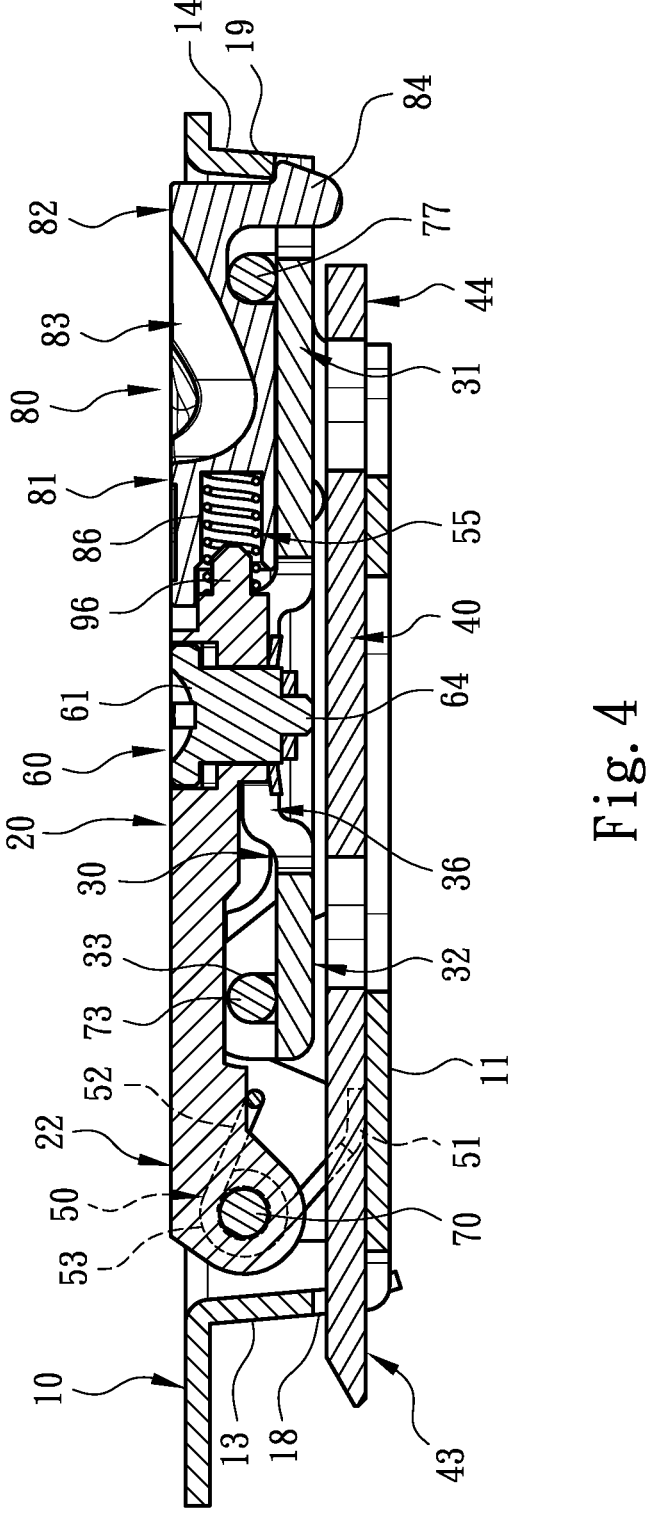
FIG. 4 is a plane sectional view of the present invention, showing that the locating section of the operation section is engaged with the case body so as to position the actuator body in a closed position.

As shown in FIG. 4, the locating section 84 of the operation member 80 is engaged or fastened with the subsidiary locating section 19 of the case body 10. At this time, the actuator body 20, the linking member 30 and the slide body 40 are closed onto the case body 10 (or the chamber 15) and the elastic unit 50 is in an energy storing state.

Figure 5:
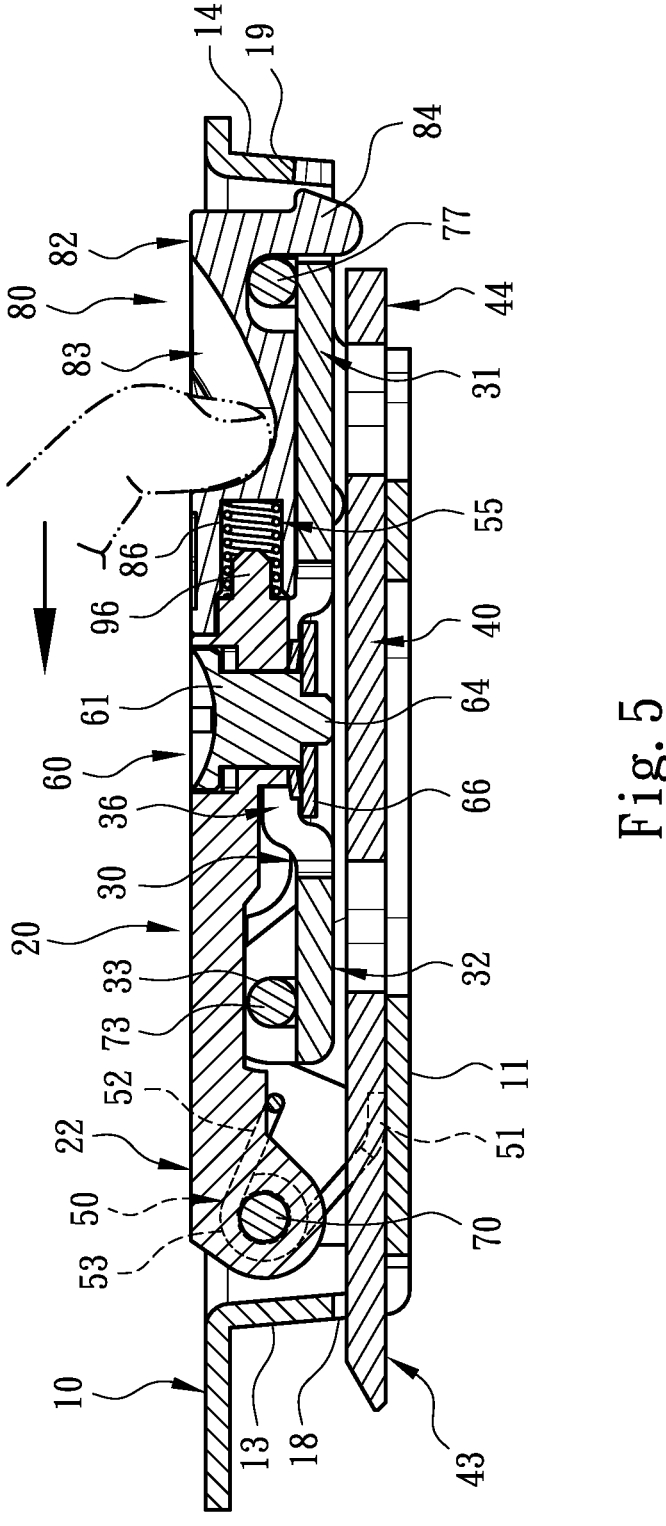
FIG. 5 is a plane sectional view of the present invention according to FIG. 4, showing that the operation section is pulled to compress the elastic member and make the locating section disengaged from the subsidiary locating section of the case body.
Figure 6:
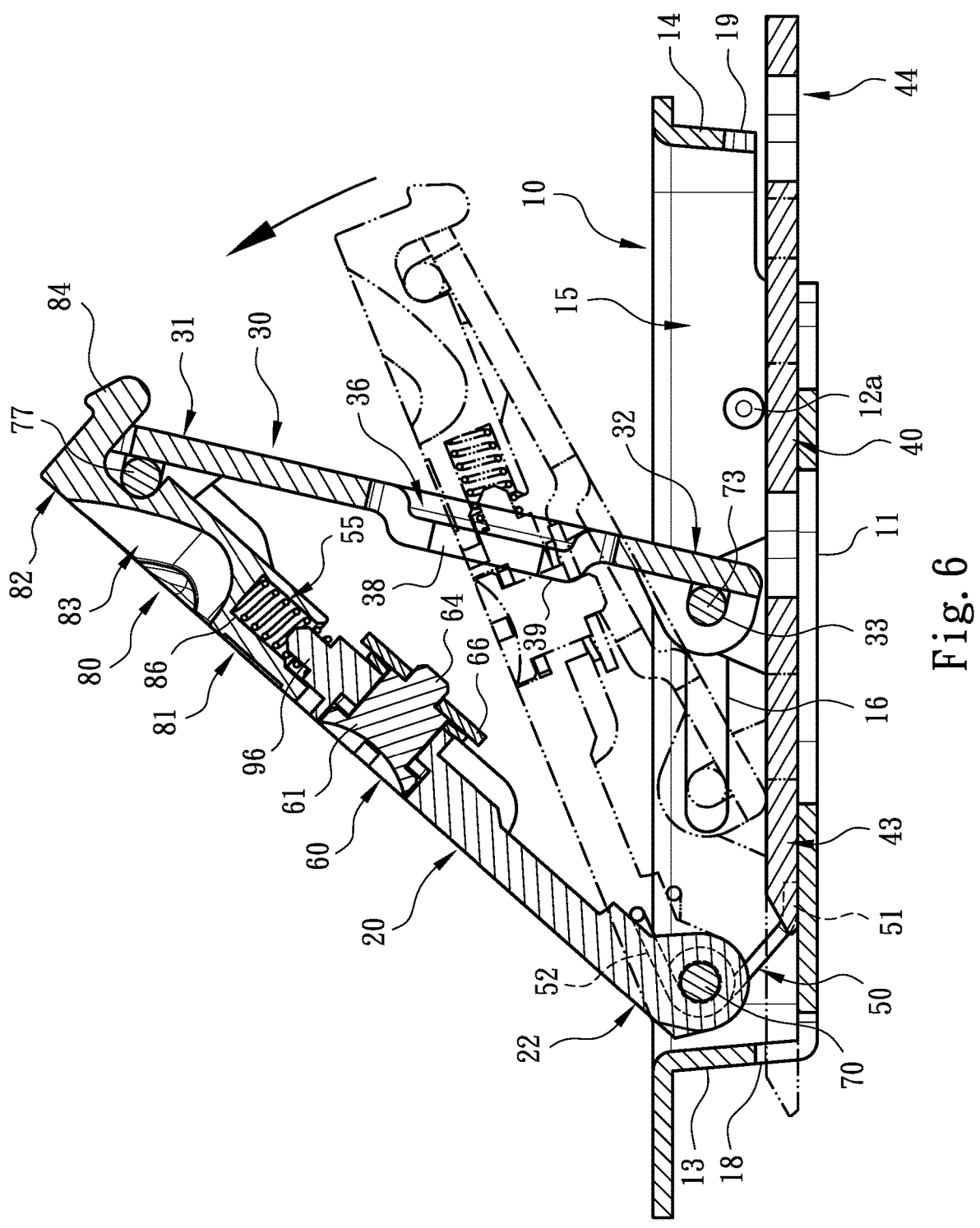
FIG. 6 is a plane sectional view of the present invention according to FIG. 4, showing that the elastic unit drives the actuator body to swing toward an upper side or an open position and the linking member and the slide body are driven to move.

Please refer to FIG. 5. After an operator (finger) pulls the base body 83 of the operation member 80 to move in the axial direction X toward the left side of the drawing, the elastic member 55 is compressed by the operation member 80 to store energy and the locating section 84 is disengaged from the subsidiary locating section 19 of the case body 10. At this time, the elastic unit 50 releases the stored energy to push the actuator body 20 to move toward the open position. At the same time, the linking member 30 is driven to move as shown in FIG. 6.

As shown in the drawings, the actuator body 20 makes the second end 32 of the linking member 30 drive the shaft pin 73 to move along the slots 16. Also, the slide body 40 is moved between the main end wall 13 (or the opening 18) and the subsidiary end wall 14 of the case body 10.

It should be noted that when the operator pulls the operation member 80 to move in the axial direction X, the direction of the application force (or the action force) is determined with some issues taken into consideration as follows:

1. The direction of the application force (or the action force) is the same as the direction of the (horizontal) component force of the force for moving the actuator body 20 toward the open position. This helps in opening the actuator body 20 (and/or the linking member 30 and the slide body 40).

2. The base body 83 of the operation member 80 is formed with a depression structure to meet ergonomics (or the pulling/application force of the operator's finger). This also helps in opening the actuator body 20 (and/or the linking member 30).

In a preferred embodiment, when the actuator body 20 is closed onto the case body 10, the main end 43 of the slide body 40 partially outward protrudes from the opening 18 of the main end wall 13 of the case body 10. When the actuator body 20 is positioned in the open position, the subsidiary end 44 of the slide body 40 is driven to outward protrude from the subsidiary end wall 14 of the case body 10.

To speak representatively, in comparison with the conventional structure, the lock device structure of the present invention has the following advantages:

1. The case body 10, the actuator body 20, the linking member 30 and the slide body 40 and the relevant components and structures have been redesigned. For example, the free end 21 of the actuator body 20 has two protruding arm sections 25 and a notch section 26 for mounting the operation member 80 therein. Two rails 95 are disposed on inner sides of the arm sections 25. A mounting section 96 is disposed inside the notch section 26 for assembling with or locating an elastic member 55. Two subsidiary rails 85 are disposed on two sides of the operation member 80 and assembled with the rails 95, whereby the operation member 80 can more smoothly move in the axial direction X. The operation member 80 is formed with a subsidiary mounting section 86 for accommodating the elastic member 55. The subsidiary section 82 of the operation member 80 is formed with a locating section 84 engaged with the subsidiary locating section 19 of the subsidiary end wall 14 of the case body 10 for controlling the actuator body 20 and the linking member 30 to close onto the case body 10 or permitting the actuator body 20 to drive the linking member 30 and the slide body 40 to move. The present invention is obviously different from the conventional structure in use and operation form. Also, the present invention changes the structure or assembling relationship of the conventional lock device.

2. Especially, in the condition that the structure is simplified and the operation is facilitated (or smoothened), the cooperative structures of the actuator body 20 and the operation member 80 of the present invention obviously improve the shortcoming of the conventional structure that the operation direction is reverse to the opening direction. In addition, during the operation process, the present invention enables an operator to easily make the actuator body 20 (and/or the linking member 30 and the slide body 40) move (smoothly) toward the open position so that the operation is facilitated.

In conclusion, the lock device structure of the present invention is different from the conventional lock device in space form and is advantageous over the conventional lock device. The lock device structure of the present invention is greatly advanced and inventive.

The above embodiments are only used to illustrate the present invention, not intended to limit the scope thereof. Many modifications of the above embodiments can be made without departing from the spirit of the present invention.

What is claimed is:

1. A lock device structure comprising:

an assembly of a case body 10 and an actuator body 20, and a linking member 30 and a slide body 40 mounted on the case body 10, the actuator body 20 being defined with an axial direction X, the actuator body 20 having a free end 21 and a pivoted end 22 pivotally connected with the case body 10 in cooperation with an elastic unit 50, whereby the actuator body 20 can reciprocally move, the free end 21 of the actuator body 20 having two protruding arm sections 25 and a notch section 26 positioned between the two arm sections 25, an operation member 80 and an elastic member 55 being disposed in the notch section 26, the elastic member 55 serving to make the operation member 80 reciprocally move in the axial direction X of the actuator body 20, the linking member 30 having a freely rotatable first end 31 and a second end 32 connected with the slide body 40, the first end 31 being pivotally connected with the free end 21 of the actuator body 20, wherein two rails 95 are disposed on inner sides of the arm sections 25 in parallel to the axial direction X of the actuator body 20, tail sections of the arm sections 25 being formed with pinholes 27 for correspondingly pivotally connecting with a shaft pin 77, a mounting section 96 being disposed on a section of the actuator body 20 inside the notch section 26 distal from the tail sections of the arm sections 25 for assembling with the elastic member 55, the mounting section 96 being in the form of a stake or a socket structure, whereby when the operation member 80 reciprocally moves in the axial direction X, the actuator body 20 is permitted to move from a closed position to an open position to drive the linking member 30 and the slide body 40 to move, a direction of an application force for moving the operation member 80 in the axial direction X being the same as a direction of a horizontal component of a force for moving the actuator body 20 toward the open position.

2. The lock device structure as claimed in claim 1, wherein the case body 10 has a bottom wall 11, two sidewalls 12 extending in a direction in parallel to the axial direction of the case body 10 and a main end wall 13 and a subsidiary end wall 14 connected with the sidewalls 12 and perpendicular to the axial direction of the case body 10, the bottom wall 11, the sidewalls 12, the main end wall 13 and the subsidiary end wall 14 together defining an open chamber 15 of the case body 10 for accommodating the actuator body 20, the linking member 30 and the slide body 40, each of the sidewalls 12 of the case body 10 being formed with a slot 16, a raised structure 12a being disposed on an inner side of each of the sidewalls 12 of the case body 10, the main end wall 13 being formed with an opening 18, the subsidiary end wall 14 being formed with a subsidiary locating section 19 in the form of a window, the actuator body 20 being a plate body structure, the pivoted end 22 of the actuator body 20 having a shafted section 23 and two recessed sections 24 formed at two ends of the shafted section 23 for accommodating the elastic unit 50, the elastic unit 50 is selectively in the form of a torsion spring having two coiled sections 53, two first sections 51 and two second sections 52 connected with the coiled sections 53 and an extension section 54 perpendicularly connected with the second sections 52, the shaft section 23 being assembled with a shaft 70, which is fitted through the coiled sections 53 of the elastic unit 50 and two shaft holes 17 formed on the sidewalls 12 of the case body 10, the first sections 51 of the elastic unit 50 abutting against the bottom wall 11 of the case body 10, while the second sections 52 of the elastic unit 50 abutting against the recessed sections 24 of the actuator body 20, the arm sections of the actuator body 20 being in parallel to each other, the arm sections 25 being formed with dented sections 25a, tail sections of the arm sections 25 being formed with pinholes 27.

3. The lock device structure as claimed in claim 2, wherein the operation member 80 includes an operable base body 83 and a main section 81 and a subsidiary section 82 positioned at two ends of the base body 83, two subsidiary rails 85 being disposed on two sides of the operation member 80, the operation member 80 being formed with a subsidiary mounting section 86 for assembling with the elastic member 55, the subsidiary section 82 being formed with a hook-shaped locating section 84, when the actuator body 20 is positioned in the closed position, the locating section 84 is engaged with the case body 10, whereby the actuator body 20 is securely engaged with the case body 10, after the operation member 80 is moved, the locating section 84 is disengaged from the subsidiary locating section 19 of the case body 10, the elastic member 55 being selectively in the form of a coiled spring and having a first section 56 and a second section 58.

4. The lock device structure as claimed in claim 3, wherein the first end 31 of the linking member 30 is formed with pinholes 37 pivotally connected with a shaft pin 77, whereby the first end 31 of the linking member 30 is freely rotatably pivotally connected with the free end 21 of the actuator body 20, the second end 32 of the linking member 30 being formed with a shafted section 33 for pivotally connecting with a shaft pin 73, whereby the second end 32 of the linking member 30 can freely move, the shaft pin 73 being also pivotally connected with the slide body 40, the slide body 40 being a plate body and having a main end 43 and a subsidiary end 44, two assembling sections 41 in the form of lug structure being disposed on the slide body 40 between the main end 43 and the subsidiary end 44, each assembling section 41 being formed with a shaft hole 42, the shaft pin 73 being assembled with the linking member 30 and the shaft holes 42 of the assembling sections 41 of the slide body 40, two ends of the shaft pin 73 being pivotally connected with the case body 10.

5. The lock device structure as claimed in claim 4, wherein a perforation 28 is formed on the actuator body 20 between the free end 21 and the pivoted end 22, a restriction section 29 being formed on the perforation 28, a lock mechanism 60 being mounted in the perforation 28, the lock mechanism 60 including an assembly of a rotary body 61 received in the perforation 28 and a lock plate 62 pivotally connected with the rotary body 61, the rotary body 61 being formed with a subsidiary restriction section 63 and a base section 64 in the form of a stem structure, the lock plate 62 being assembled with a wing section 66 having a connection section 65 in the form of a hole, the base section 64 being pivotally connected with the connection section 65, a lock hole 36 being formed on the linking member 30 between the first end 31 and the second end 32, the lock hole 36 being composed of a through hole 38 and an annular raised section 39 formed around the through hole 38, two recesses 87 are formed on two sides of the base body 83 in connection with the depression structure.

6. The lock device structure as claimed in claim 3, wherein a perforation 28 is formed on the actuator body 20 between the free end 21 and the pivoted end 22, a restriction section 29 being formed on the perforation 28, a lock mechanism 60 being mounted in the perforation 28, the lock mechanism 60 including an assembly of a rotary body 61 received in the perforation 28 and a lock plate 62 pivotally connected with the rotary body 61, the rotary body 61 being formed with a subsidiary restriction section 63 and a base section 64 in the form of a stem structure, the lock plate 62 being assembled with a wing section 66 having a connection section 65 in the form of a hole, the base section 64 being pivotally connected with the connection section 65, a lock hole 36 being formed on the linking member 30 between the first end 31 and the second end 32, the lock hole 36 being composed of a through hole 38 and an annular raised section 39 formed around the through hole 38, two recesses 87 are formed on two sides of the base body 83 in connection with the depression structure.

7. The lock device structure as claimed in claim 2, wherein the first end 31 of the linking member 30 is formed with pinholes 37 pivotally connected with a shaft pin 77, whereby the first end 31 of the linking member 30 is freely rotatably pivotally connected with the free end 21 of the actuator body 20, the second end 32 of the linking member 30 being formed with a shafted section 33 for pivotally connecting with a shaft pin 73, whereby the second end 32 of the linking member 30 can freely move, the shaft pin 73 being also pivotally connected with the slide body 40, the slide body 40 being a plate body and having a main end 43 and a subsidiary end 44, two assembling sections 41 in the form of lug structure being disposed on the slide body 40 between the main end 43 and the subsidiary end 44, each assembling section 41 being formed with a shaft hole 42, the shaft pin 73 being assembled with the linking member 30 and the shaft holes 42 of the assembling sections 41 of the slide body 40, two ends of the shaft pin 73 being pivotally connected with the case body 10.

8. The lock device structure as claimed in claim 2, wherein a perforation 28 is formed on the actuator body 20 between the free end 21 and the pivoted end 22, a restriction section 29 being formed on the perforation 28, a lock mechanism 60 being mounted in the perforation 28, the lock mechanism 60 including an assembly of a rotary body 61 received in the perforation 28 and a lock plate 62 pivotally connected with the rotary body 61, the rotary body 61 being formed with a subsidiary restriction section 63 and a base section 64 in the form of a stem structure, the lock plate 62 being assembled with a wing section 66 having a connection section 65 in the form of a hole, the base section 64 being pivotally connected with the connection section 65, a lock hole 36 being formed on the linking member 30 between the first end 31 and the second end 32, the lock hole 36 being composed of a through hole 38 and an annular raised section 39 formed around the through hole 38.

9. The lock device structure as claimed in claim 1, wherein the operation member 80 includes an operable base body 83 and a main section 81 and a subsidiary section 82 positioned at two ends of the base body 83, two subsidiary rails 85 being disposed on two sides of the operation member 80 for assembling with the rails 95, the operation member 80 being formed with a subsidiary mounting section 86 for assembling with the elastic member 55, the subsidiary section 82 being formed with a hook-shaped locating section 84, when the actuator body 20 is positioned in the closed position, the locating section 84 is engaged with the case body 10, whereby the actuator body 20 is securely engaged with the case body 10, the elastic member 55 being selectively in the form of a coiled spring and having a first section 56 assembled on the mounting section 96 and a second section 58 pressed against the subsidiary mounting section 86.

10. The lock device structure as claimed in claim 9, wherein the first end 31 of the linking member 30 is formed with pinholes 37 pivotally connected with a shaft pin 77, whereby the first end 31 of the linking member 30 is freely rotatably pivotally connected with the free end 21 of the actuator body 20, the second end 32 of the linking member 30 being formed with a shafted section 33 for pivotally connecting with a shaft pin 73, whereby the second end 32 of the linking member 30 can freely move, the shaft pin 73 being also pivotally connected with the slide body 40, the slide body 40 being a plate body and having a main end 43 and a subsidiary end 44, two assembling sections 41 in the form of lug structure being disposed on the slide body 40 between the main end 43 and the subsidiary end 44, each assembling section 41 being formed with a shaft hole 42, the shaft pin 73 being assembled with the linking member 30 and the shaft holes 42 of the assembling sections 41 of the slide body 40, two ends of the shaft pin 73 being pivotally connected with the case body 10.

11. The lock device structure as claimed in claim 1, wherein the first end 31 of the linking member 30 is formed with pinholes 37 pivotally connected with a shaft pin 77, whereby the first end 31 of the linking member 30 is freely rotatably pivotally connected with the free end 21 of the actuator body 20, the second end 32 of the linking member 30 being formed with a shafted section 33 for pivotally connecting with a shaft pin 73, whereby the second end 32 of the linking member 30 can freely move, the shaft pin 73 being also pivotally connected with the slide body 40, the slide body 40 being a plate body and having a main end 43 and a subsidiary end 44, two assembling sections 41 in the form of lug structure being disposed on the slide body 40 between the main end 43 and the subsidiary end 44, each assembling section 41 being formed with a shaft hole 42, the shaft pin 73 being assembled with the linking member 30 and the shaft holes 42 of the assembling sections 41 of the slide body 40, two ends of the shaft pin 73 being pivotally connected with the case body 10.

12. The lock device structure as claimed in claim 1, wherein a perforation 28 is formed on the actuator body 20 between the free end 21 and the pivoted end 22, a restriction section 29 being formed on the perforation 28, a lock mechanism 60 being mounted in the perforation 28, the lock mechanism 60 including an assembly of a rotary body 61 received in the perforation 28 and a lock plate 62 pivotally connected with the rotary body 61, the rotary body 61 being formed with a subsidiary restriction section 63 and a base section 64 in the form of a stem structure, the lock plate 62 being assembled with a wing section 66 having a connection section 65 in the form of a hole, the base section 64 being pivotally connected with the connection section 65, a lock hole 36 being formed on the linking member 30 between the first end 31 and the second end 32, the lock hole 36 being composed of a through hole 38 and an annular raised section 39 formed around the through hole 38.

13. A lock device structure comprising:

an assembly of a case body 10 and an actuator body 20, and a linking member 30 and a slide body 40 mounted on the case body 10, the actuator body 20 being defined with an axial direction X, the actuator body 20 having a free end 21 and a pivoted end 22 pivotally connected with the case body 10 in cooperation with an elastic unit 50, whereby the actuator body 20 can reciprocally move, the free end 21 of the actuator body 20 having two protruding arm sections 25 and a notch section 26 positioned between the two arm sections 25, an operation member 80 and an elastic member 55 being disposed in the notch section 26, the elastic member 55 serving to make the operation member 80 reciprocally move in the axial direction X of the actuator body 20, the linking member 30 having a freely rotatable first end 31 and a second end 32 connected with the slide body 40, the first end 31 being pivotally connected with the free end 21 of the actuator body 20, wherein the operation member 80 includes an operable base body 83 and a main section 81 and a subsidiary section 82 positioned at two ends of the base body 83, two subsidiary rails 85 being disposed on two sides of the operation member 80, the operation member 80 being formed with a subsidiary mounting section 86 for assembling with the elastic member 55, the subsidiary section 82 being formed with a hook-shaped locating section 84, whereby when the operation member 80 reciprocally moves in the axial direction X, the actuator body 20 is permitted to move from a closed position to an open position to drive the linking member 30 and the slide body 40 to move, when the actuator body 20 is positioned in the closed position, the locating section 84 is engaged with the case body 10, whereby the actuator body 20 is securely engaged with the case body 10, the elastic member 55 being selectively in the form of a coiled spring and having a first section 56 and a second section 58.

14. The lock device structure as claimed in claim 13, wherein the first end 31 of the linking member 30 is formed with pinholes 37 pivotally connected with a shaft pin 77, whereby the first end 31 of the linking member 30 is freely rotatably pivotally connected with the free end 21 of the actuator body 20, the second end 32 of the linking member 30 being formed with a shafted section 33 for pivotally connecting with a shaft pin 73, whereby the second end 32 of the linking member 30 can freely move, the shaft pin 73 being also pivotally connected with the slide body 40, the slide body 40 being a plate body and having a main end 43 and a subsidiary end 44, two assembling sections 41 in the form of lug structure being disposed on the slide body 40 between the main end 43 and the subsidiary end 44, each assembling section 41 being formed with a shaft hole 42, the shaft pin 73 being assembled with the linking member 30 and the shaft holes 42 of the assembling sections 41 of the slide body 40, two ends of the shaft pin 73 being pivotally connected with the case body 10.

15. A lock device structure comprising:

an assembly of a case body 10 and an actuator body 20, and a linking member 30 and a slide body 40 mounted on the case body 10, the actuator body 20 being defined with an axial direction X, the actuator body 20 having a free end 21 and a pivoted end 22 pivotally connected with the case body 10 in cooperation with an elastic unit 50, whereby the actuator body 20 can reciprocally move, the free end 21 of the actuator body 20 having two protruding arm sections 25 and a notch section 26 positioned between the two arm sections 25, an operation member 80 and an elastic member 55 being disposed in the notch section 26, the elastic member 55 serving to make the operation member 80 reciprocally move in the axial direction X of the actuator body 20, the linking member 30 having a freely rotatable first end 31 and a second end 32 connected with the slide body 40, the first end 31 being pivotally connected with the free end 21 of the actuator body 20, wherein the first end 31 of the linking member 30 is formed with pinholes 37 pivotally connected with a shaft pin 77, whereby the first end 31 of the linking member 30 is freely rotatably pivotally connected with the free end 21 of the actuator body 20, the second end 32 of the linking member 30 being formed with a shafted section 33 for pivotally connecting with a shaft pin 73, whereby the second end 32 of the linking member 30 can freely move, the shaft pin 73 being also pivotally connected with the slide body 40, the slide body 40 being a plate body and having a main end 43 and a subsidiary end 44, two assembling sections 41 in the form of lug structure being disposed on the slide body 40 between the main end 43 and the subsidiary end 44, each assembling section 41 being formed with a shaft hole 42, the shaft pin 73 being assembled with the linking member 30 and the shaft holes 42 of the assembling sections 41 of the slide body 40, two ends of the shaft pin 73 being pivotally connected with the case body 10, whereby when the operation member 80 reciprocally moves in the axial direction X, the actuator body 20 is permitted to move from a closed position to an open position to drive the linking member 30 and the slide body 40 to move.

* * * * *